（12） United States Patent
Suzuki et al.

(10) Patent No.: US 10,131,986 B2
(45) Date of Patent: Nov. 20, 2018

(54) METHOD OF FORMING METAL FILM

(71) Applicant: TOKYO ELECTRON LIMITED, Tokyo (JP)

(72) Inventors: Kenji Suzuki, Tokyo (JP); Takanobu Hotta, Nirasaki (JP); Koji Maekawa, Nirasaki (JP); Yasushi Aiba, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 75 days.

(21) Appl. No.: 15/161,674

(22) Filed: May 23, 2016

(65) Prior Publication Data
US 2016/0348234 A1 Dec. 1, 2016

(30) Foreign Application Priority Data

May 28, 2015 (JP) ................. 2015-108445

(51) Int. Cl.
C23C 16/00 (2006.01)
C23C 16/04 (2006.01)
C23C 16/14 (2006.01)
C23C 16/455 (2006.01)
H01L 27/11582 (2017.01)

(52) U.S. Cl.
CPC ............ C23C 16/045 (2013.01); C23C 16/14 (2013.01); C23C 16/45527 (2013.01); H01L 27/11582 (2013.01)

(58) Field of Classification Search
CPC .. C23C 16/045; C23C 16/14; C23C 16/45527
See application file for complete search history.

(56) References Cited

U.S. PATENT DOCUMENTS

2008/0280438 A1* 11/2008 Lai ..................... C23C 16/0281
438/680
2013/0302980 A1* 11/2013 Chandrashekar ..........................
H01L 21/76877
438/666

FOREIGN PATENT DOCUMENTS

| JP | 2003-193233 A | 7/2003 |
| JP | 2004-273764 A | 9/2004 |
| JP | 2006-028572 A | 2/2006 |
| KR | 1020080101745 A | 11/2008 |

(Continued)

OTHER PUBLICATIONS

J.A.M. Ammerlaan, et al., "Chemical vapor deposition of tungsten by H2 reduction of WCl6", Applied Surface Science 53(1991), pp. 24-29.

*Primary Examiner* — Kelly M Gambetta
(74) *Attorney, Agent, or Firm* — Nath, Goldberg & Meyer; Jerald L. Meyer

(57) ABSTRACT

There is provided a method for forming a metal film on a target substrate having a complex-shaped portion and a flat portion, the target substrate being loaded into a chamber which is maintained under a depressurized atmosphere, by sequentially supplying a metal chloride gas as a raw material gas and a reduction gas for reducing a metal chloride into the chamber while purging the chamber in the course of sequentially supplying the metal chloride gas and the reduction gas, the method including: forming a first metal film by supplying the metal chloride gas at a relatively low flow rate; and forming a second metal film by supply the metal chloride gas at a relatively high flow rate.

11 Claims, 12 Drawing Sheets

(56) References Cited

FOREIGN PATENT DOCUMENTS

KR    101160805 B1    6/2012

* cited by examiner

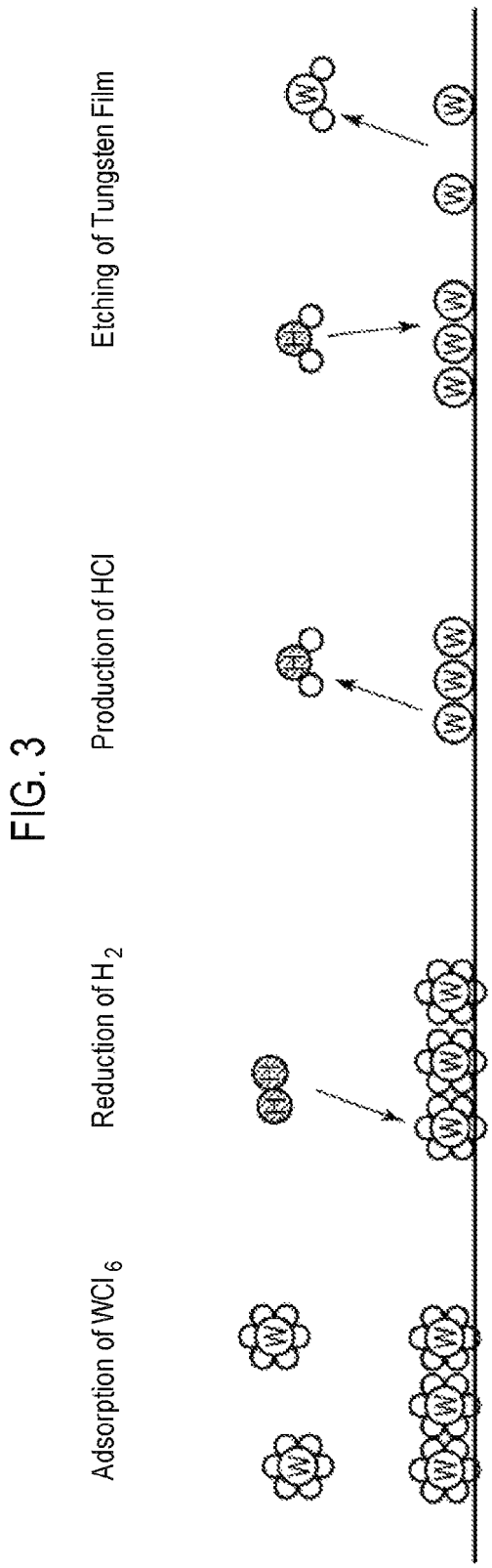

Flat Portion

Patterned Portion

METHOD OF FORMING METAL FILM

CROSS-REFERENCE TO RELATED APPLICATION

This application claims the benefit of Japanese Patent Application No. 2015-108445, filed on May 28, 2015, in the Japan Patent Office, the disclosure of which is incorporated herein in its entirety by reference.

TECHNICAL FIELD

The present disclosure relates to a method for forming a metal film.

BACKGROUND

In manufacturing a large-scale integration (LSI), tungsten has been widely used for MOSFET gate electrodes, source-drain contacts, memory wordlines and the like. A Cu wiring has been mainly used in a multilayer wiring process. However, Cu has a poor heat resistance and is easily diffused. As such, tungsten has been used for a portion that requires a heat resistance or a portion of which an electric property may deteriorate due to the diffusion of Cu.

A physical vapor deposition (PVD) method has been used as a film forming process of a tungsten film. However, it is difficult to use such a PVD method for a portion that requires a high coverage rate (step coverage). Because of this, a chemical vapor deposition (CVD) method which provides good step coverage has been performed to form the tungsten film.

As a method of forming a tungsten film (CVD-tungsten film) using such a CVD method, a method of inducing a reaction of $WF_6 + 3H_2 \rightarrow W + 6HF$ on a semiconductor wafer as a target substrate, by using a tungsten hexafluoride ($WF_6$) as a raw material gas and an $H_2$ gas as a reduction gas, is generally used.

However, when the tungsten film is formed by the CVD method using the $WF_6$ gas, fluorine contained in $WF_6$ reduces a gate insulation film in a semiconductor device, particularly in gate electrodes, memory wordlines or the like, which deteriorates an electric property of the semiconductor device.

As a raw material gas used in forming a CVD-tungsten film containing no fluorine, tungsten hexachloride ($WCl_6$) is known. Although chlorine has a reduction property like fluorine, reactivity of chlorine is weaker than that of fluorine. As such, chlorine is expected to hardly affect the electric property.

In recent years, as the semiconductor device becomes finer and finer, it is difficult to use the CVD method, which is known to provide good step coverage, to bury a film into a complex-shaped pattern. Thus, from the viewpoint of obtaining higher step coverage, an atomic layer deposition (ALD) method which sequentially supplies a raw material gas and a reduction gas while performing a purge process in the course of sequentially supplying the raw material gas and the reduction gas, is getting a lot of attention.

In some instances, a complex-shaped semiconductor device such as a three-dimensional (3D) NAND flash memory has been developed. Formation of a tungsten film on such a complex-shaped semiconductor device requires supplying a film-forming raw material at a high flow rate.

Meanwhile, there are generally simple flat portions such as peripheral circuits even in the complex-shaped semiconductor device. In forming a film on the device having such complex-shaped and flat portions by using a chloride such as tungsten hexachloride ($WCl_6$) as a film-forming raw material, if the chloride raw material is supplied at a flow rate that is required to form the film on the complex-shaped portion, hardly any of the film will be formed on the flat portion.

SUMMARY

Some embodiments of the present disclosure provide to a method for forming a metal film on a target substrate having complex-shaped and flat portions using a chloride raw material such that the metal film is formed both in the complex-shaped and flat portions.

According to one embodiment of the present disclosure, there is provided a method for forming a metal film on a target substrate having a complex-shaped portion and a flat portion, the target substrate being loaded into a chamber which is maintained under a depressurized atmosphere, by sequentially supplying a metal chloride gas as a raw material gas and a reduction gas for reducing a metal chloride into the chamber while purging the chamber in the course of sequentially supplying the metal chloride gas and the reduction gas, the method including: forming a first metal film by supplying the metal chloride gas at a relatively low flow rate; and forming a second metal film by supply the metal chloride gas at a relatively high flow rate.

According to another embodiment of the present disclosure, there is provided a non-transitory computer-readable storage medium storing a program that operates on a computer and controls a film forming apparatus, wherein the program, when executed, causes the computer to control the film forming apparatus so as to perform the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a view schematically showing a film formation state when a tungsten film is formed using a $WCl_6$ gas and an $H_2$ gas by an ALD method.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The present inventors have studied a reason why, if a metal chloride is supplied at a flow rate that is required to form a film on a complex-shaped portion, hardly any of the film is formed on a flat portion. As a result, the present inventors found that when the film is formed using the metal chloride such as tungsten hexachloride ($WCl_6$), HCl is created as a by-product which induces an etching action on the formed film, and an amount of HCl per unit area is relatively large in the flat portion so that such an etching action is significantly exerted in the flat portion. As a result of the earnest study, the present inventors found that if the metal chloride raw material is supplied at a relatively low flow rate, the film can be formed on the flat portion, whereas if the metal chloride raw material is supplied at a relatively high flow rate, the film can be formed on the entire region of the complex-shaped portion. Thus, the present inventors completed the present disclosure by supplying the metal chloride raw material at a flow rate adapted to form the film on both the complex-shaped portion and the flat portion.

<Example of Film Forming Apparatus>

Figure 1:
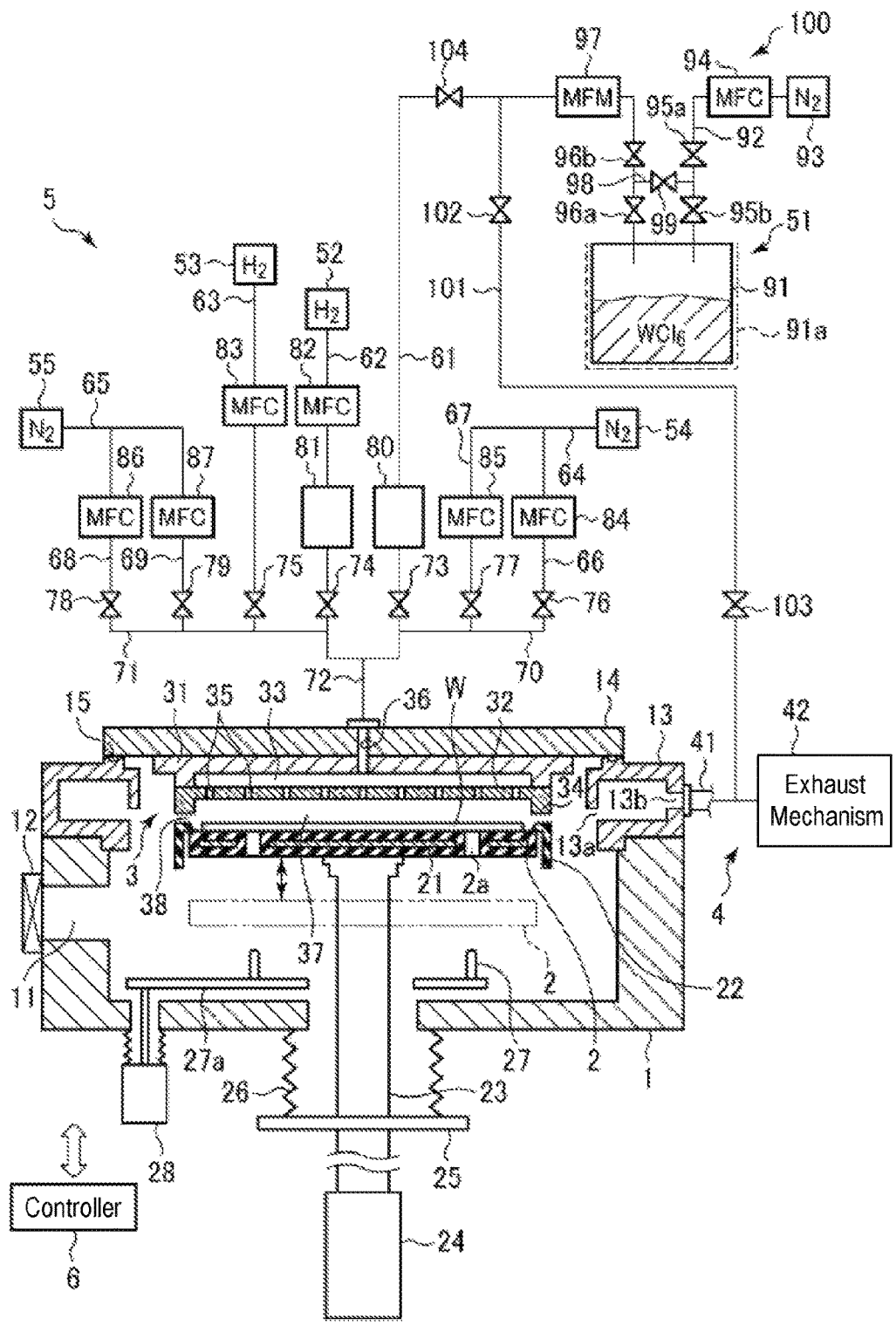
FIG. 1 is a sectional view showing an example of a tungsten film forming apparatus which is used in implementing a metal film forming method according to the present disclosure.

FIG. 1 is a sectional view showing an example of a tungsten film forming apparatus which is used in implementing a metal film forming method according to the present disclosure.

A film forming apparatus 100 includes a chamber 1, a susceptor 2 configured to horizontally support a semiconductor wafer W (hereinafter, simply referred to as a "wafer") as a target substrate inside the chamber 1, a shower head 3 configured to supply a process gas into the chamber 1 in the form of a shower, an exhaust part 4 configured to exhaust an interior of the chamber 1, a process gas supply mechanism 5 configured to supply the process gas into the shower head 3, and a controller 6.

The chamber 1 is made of a metal such as Al and has a substantially cylindrical shape. A loading/unloading port 11 through which the wafer W is loaded into and unloaded from the chamber 1 is formed in a sidewall of the chamber 1. The loading/unloading port 11 is opened and closed by a gate valve 12. An annular exhaust duct 13 having a rectangular cross-section is installed on a main body of the chamber 1. The exhaust duct 13 has a slit 13a formed along an inner peripheral surface of the exhaust duct 13. Further, the exhaust duct 13 has an exhaust port 13b formed in an outer wall of the exhaust duct 13. A ceiling wall 14 is installed on a top face of the exhaust duct 13 so as to block an upper opening of the chamber 1. A sealing ring 15 is air-tightly installed between the ceiling wall 14 and the exhaust duct 13.

The susceptor 2 has a disk shape which corresponds to a size of the wafer W, and is supported by a support member 23. The susceptor 2 is made of a ceramic material such as an aluminum nitride (AlN) or a metallic material such as an aluminum- or nickel-based alloy. A heater 21 for heating the wafer W is embedded in the susceptor 2. The heater 21 is configured to generate heat based on power supplied from a heater power supply (not shown). An output of the heater 21 is controlled according to a temperature signal obtained at a thermocouple (not shown) such that the wafer W is controlled to a predetermined temperature. The thermocouple is installed near a wafer mounting surface (where the wafer W is mounted) in an upper surface of the susceptor 2.

The susceptor 2 is provided with a cover member 22 made of ceramics such as alumina to cover an outer peripheral area of the wafer mounting surface and a lateral side of the susceptor 2.

The support member 23 configured to support the susceptor 2 is configured to extend from the center of a lower surface of the susceptor 2 toward a position below the chamber 1 through a hole formed in a bottom wall of the chamber 1. A lower end of the support member 23 is connected to an elevating mechanism 24. With an operation of the elevating mechanism 24, the susceptor 2 is configured to vertically move between a process position (a current position of the susceptor 2 shown in FIG. 1) and a transfer position (indicated by a dashed double-dotted line in FIG. 1) where the wafer W can be transferred, by the support member 23. Further, a flange part 25 through which the support member 23 penetrates is installed at a position below the chamber 1. A bellows 26 is installed between a bottom surface of the chamber 1 and the flange 25. The bellows 26 is configured to isolate an internal atmosphere of the chamber 1 from ambient air and to be flexible with the vertical movement of the susceptor 2.

Three wafer support pins 27 (only two of them are shown in FIG. 1) are installed to protrude upward from an elevating plate 27a in the vicinity of the bottom surface of the chamber 1. The wafer support pins 27 are configured to be lifted and lowered by the elevating plate 27a with an operation of an elevating mechanism 28 installed below the chamber 1. Further, the wafer support pins 27 are configured to penetrate through-holes 2a formed in the susceptor 2 placed at the transfer position so that they come in and out of the upper surface of the susceptor 2. By lifting and lowering the wafer support pins 27 in this way, the wafer W is transferred between a wafer transfer mechanism (not shown) and the susceptor 2.

The shower head 3 made of a metal is installed to face the susceptor 2, and has a diameter substantially identical to that of the susceptor 2. The shower head 3 includes a main body 31 fixed to the ceiling wall 14 of the chamber 1, and a shower plate 32 connected to a lower portion of the main body 31. A gas diffusion space 33 is defined between the main body 31 and the shower plate 32. The gas diffusion space 33 is connected to a gas inlet hole 36 which is formed to penetrate both central portions of the main body 31 and the ceiling wall 14 of the chamber 1. The shower plate 32A has an annular protrusion 34 which is formed to protrude downward from a peripheral portion of the shower plate 32. Gas discharge holes 35 are formed in an inner flat surface of the shower plate 32 other than the annular protrusion 34.

When the susceptor 2 is placed at the process position, a process space 37 is defined between the shower plate 32 and the susceptor 2, and the annular protrusion 34 and an upper surface of the cover member 22 of the susceptor 2 approach each other to form an annular gap 38.

The exhaust part 4 includes an exhaust pipe 41 connected to the exhaust port 13b of the exhaust duct 13, and an exhaust mechanism 42 connected to the exhaust pipe 41. The exhaust mechanism 42 is provided with a vacuum pump, a pressure control valve or the like. When the wafer is processed, a gas inside the chamber 1 flows to the exhaust duct 13 through the slit 13a, and subsequently, is exhausted from the exhaust duct 13 through the exhaust pipe 41 by the exhaust mechanism 42 of the exhaust part 4.

The process gas supply mechanism 5 includes a $WCl_6$ gas supply mechanism 51 for supplying a $WCl_6$ gas used as a tungsten chloride gas that is a tungsten raw material gas, a first $H_2$ gas supply source 52 for supplying an $H_2$ gas as a main reduction gas, a second $H_2$ gas supply source 53 for supplying an $H_2$ gas as an additive reduction gas, and a first $N_2$ gas supply source 54 and a second $N_2$ gas supply source 55 for supplying an $N_2$ gas as a purge gas. Further, the process gas supply mechanism 5 includes a $WCl_6$ gas supply line 61 installed to extend from the $WCl_6$ gas supply source 51, a first $H_2$ gas supply line 62 installed to extend from the first $H_2$ gas supply source 52, a second $H_2$ gas supply line 63 installed to extend from the second $H_2$ gas supply source 53, a first $N_2$ gas supply line 64 which is installed to extend from the first $N_2$ gas supply source 54 and through which the $N_2$ gas is supplied to the $WCl_6$ gas supply line 61, and a second $N_2$ gas supply line 65 which is installed to extend from the second $N_2$ gas supply source 55 and through which the $N_2$ gas is supplied to the first $H_2$ gas supply line 62.

The first $N_2$ gas supply line 64 is branched into a first continuous $N_2$ gas supply line 66 through which the $N_2$ gas is always supplied during the ALD method-based film forming process, and a first flash purge line 67 through which the $N_2$ gas is supplied only during a purge process. Similarly, the second $N_2$ gas supply line 65 is branched into a second continuous $N_2$ gas supply line 68 through which the $N_2$ gas is always supplied during the ALD method-based film forming process, and a second flash purge line 69 through which the $N_2$ gas is supplied only during the purge process. The first continuous $N_2$ gas supply line 66 and the first flash purge line 67 are connected to a first connection line 70 which is connected to the $WCl_6$ gas supply line 61. Further, the second $H_2$ gas supply line 63, the second continuous $N_2$ gas supply line 68 and the second flash purge line 69 are connected to a second connection line 71 which is connected to the first $H_2$ gas supply line 62. The $WCl_6$ gas supply line 61 and the first $H_2$ gas supply line 62 are joined in a joint pipe 72. The joint pipe 72 is connected to the aforementioned gas inlet hole 36.

At most downstream sides of the $WCl_6$ gas supply line 61, the first $H_2$ gas supply line 62, the second $H_2$ gas supply line 63, the first continuous $N_2$ gas supply line 66, the first flash purge line 67, the second continuous $N_2$ gas supply line 68 and the second flash purge line 69, on-off valves 73, 74, 75, 76, 77, 78 and 79 for switching the supply of respective gases during the ALD process are respectively installed. Further, mass flow controllers (MFC) 82, 83, 84, 85, 86 and 87 as flow rate controllers are installed at upstream sides of the on-off valves 74, 75, 76, 77, 78 and 79 of the first $H_2$ gas supply line 62, the second $H_2$ gas supply line 63, the first continuous $N_2$ gas supply line 66, the first flash purge line 67, the second continuous $N_2$ gas supply line 68 and the second flash purge line 69, respectively. Furthermore, buffer tanks 80 and 81 are respectively installed in the $WCl_6$ gas supply line 61 and the first $H_2$ gas supply line 62 such that required gases can be supplied in a short period of time.

The $WCl_6$ gas supply mechanism 51 includes a film-forming raw material tank 91 which stores $WCl_6$ therein. $WCl_6$ is solid at room temperature. Such a solid $WCl_6$ is stored in the film-forming raw material tank 91. A heater 91a is installed around the film-forming raw material tank 91 so that the film-forming raw material within the film-forming raw material tank 91 is heated to a suitable temperature, thus sublimating the $WCl_6$ material The $WCl_6$ gas supply line 61 is inserted into the film-forming raw material tank 91 from above.

Further, the $WCl_6$ gas supply mechanism 51 includes: a carrier gas pipe 92 inserted into the film-forming raw material tank 91 from above; a carrier $N_2$ gas supply source 93 for supplying an $N_2$ gas as a carrier gas to the carrier gas pipe 92; a mass flow controller (MFC) 94 as a flow rate controller and on-off valves 95a and 95b positioned at a downstream side of the mass flow controller 94, which are connected to the carrier gas pipe 92; and on-off valves 96a and 96b and a flowmeter (MFM) 97, which are installed in the $WCl_6$ gas supply line 61 in the vicinity of the film-forming raw material tank 91. In the carrier gas pipe 92, the on-off valve 95a is installed directly below the mass flow controller 94, whereas the on-off valve 95b is installed at a side where the carrier gas pipe 92 is inserted into the film-forming raw material tank 91. The on-off valves 96a and 96b and the flowmeter 97 are sequentially arranged in the $WCl_6$ gas supply line 61 starting from a side where the $WCl_6$ gas supply line 61 is inserted into the film-forming raw material tank 91.

A bypass pipe 98 is installed to connect a portion between the on-off valve 95a and the on-off valve 95b in the carrier gas pipe 92 to a portion between the on-off valve 96a and the on-off valve 96b in the $WCl_6$ gas supply line 61. The bypass pipe 98 includes an on-off valve 99 installed therein. By closing the on-off valves 95b and 96a and opening the on-off valves 99, 95a and 96b, the $N_2$ gas supplied from the carrier $N_2$ gas supply source 93 is introduced to the $WCl_6$ gas supply line 61 through a series of the carrier gas pipe 92 and the bypass pipe 98 so that the $WCl_6$ gas supply line 61 can be purged.

One end of an EVAC pipe 101 is connected to a downstream position of the flowmeter 97 in the $WCl_6$ gas supply line 61 and the other end thereof is connected to the exhaust pipe 41. On-off valves 102 and 103 are installed in the vicinity of the $WCl_6$ gas supply line 61 and the exhaust pipe 41 in the EVAC pipe 101, respectively. Further, an on-off valve 104 is installed at a downstream side of a connection position where the EVAC pipe 101 is connected to the $WCl_6$ gas supply line 61. The on-off valves 104, 99, 95a and 95b are closed and the on-off valves 102, 103, 96a and 96b are opened to vacuum-exhaust the interior of the film-forming raw material tank 91 by the exhaust mechanism 42.

The controller 6 includes: a process controller equipped with a microprocessor (computer) for controlling respective components of the film forming apparatus 100, i.e., the valves, the power supplies, the heaters, the pumps and the like; a user interface; and a storage part. The respective components of the film forming apparatus 100 are configured to be electrically connected to the process controller such that they are controlled by the process controller. The user interface is connected to the process controller, and includes a keyboard that enables an operator to input commands for managing the respective components of the film forming apparatus 100, a display that visually displays operational states of the respective components of the film forming apparatus 100, and the like. The storage part is also connected to the process controller and stores a control program for implementing various processes which are performed in the film forming apparatus 100 under the control of the process controller; a control program (i.e., a process recipe) for executing predetermined processes in the respective components of the film forming apparatus 100 depending on process conditions; various databases; or the like. The processing recipe is stored in a storage medium (not shown) of the storage part. The storage medium may be a fixedly-installed medium such as a hard disk, or a portable medium such as a CDROM, a DVD and a semiconductor memory. Further, the process recipe may be appropriately transmitted from another device through, e.g., a dedicated line. If necessary, a predetermined process recipe may be called from the storage part according to an instruction from the user interface and then executed by the process controller so that a desired process is performed in the film forming apparatus 100 under the control of the process controller.

<Film Forming Method>

Next, an embodiment of a tungsten film forming method which is performed using the film forming apparatus 100 configured as above will be described.

(Summary of Film Forming Method)

First, a summary of the film forming method will be described.

The film forming method according to this embodiment is applied to a case where a tungsten film is formed on a wafer having a flat portion and a complex-shaped portion. The complex-shaped portion refers to a portion in which a recess having a relatively high aspect ratio is formed, whereas the flat portion refers to a portion in which no recess is formed or a recess having a relatively low aspect ratio is formed.

Figure 2A:
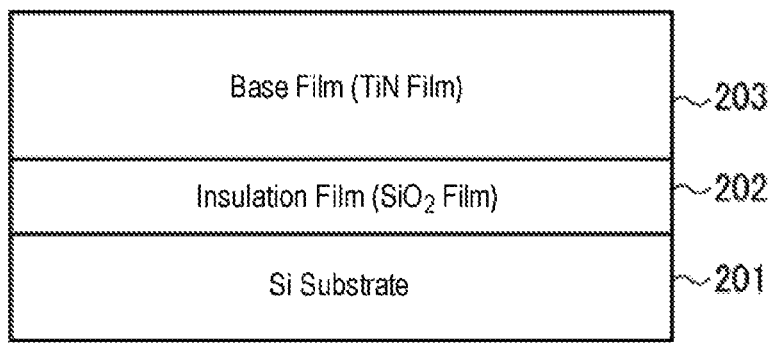
FIGS. 2A and 2B are cross-sectional process views schematically showing processes of a tungsten film forming method which is one embodiment of the metal film forming method according to the present disclosure.
Figure 2B:
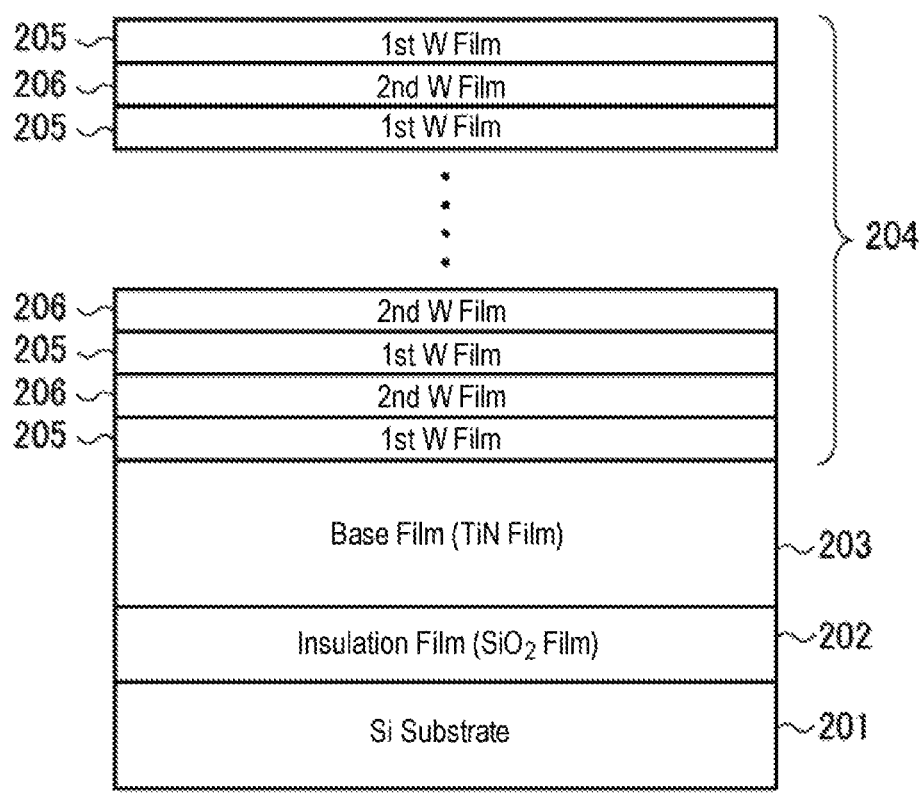

FIGS. 2A and 2B are cross-sectional process views schematically showing processes of the tungsten film forming method according to this embodiment.

First, as shown in FIG. 2A, a wafer W is prepared in which an insulation film 202 such as an SiO$_2$ film is formed on an Si substrate 201 and then a base film 203 is formed on the insulation film 202. Although in FIG. 2A, the wafer W has been shown in a planar shape for the sake of simplicity, the wafer W has the complex-shaped portion and the flat portion in practice.

An example of the base film 203 may include a titanium-based material film such as a TiN film, a TiSiN film, a Ti silicide film, a Ti film, a TiON film, a TiAlN film or the like. In some embodiments, an example of the base film 203 may include a tungsten-based compound film such as a WN film, a WSi$_x$ film, a WSiN film or the like. The formation of the base film 203 on the insulation film 202 allows the tungsten film to be formed with good adhesion.

Subsequently, the ALD method of sequentially supplying the WCl$_6$ gas as the tungsten chloride gas and the H$_2$ gas as the reduction gas into the chamber 1, while purging the interior of the chamber 1, is performed during the course of sequentially supplying the WCl$_6$ gas and the H$_2$ gas. Thus, a tungsten film 204 is formed on the base film 203. In this embodiment, as shown in FIG. 2B, a process of supplying the WCl$_6$ gas at a relatively low flow rate to form a first tungsten film (1st W film) 205 and a process of supplying the WCl$_6$ gas at a relatively high flow rate to form a second tungsten film (2nd W film) 206 are alternately repeated.

Thus, the first tungsten film 205 and the second tungsten film 206 are alternately formed in multiple layers so that the tungsten film 204 is obtained.

Next, the reason for employing such a film forming method will be described.

When the tungsten film is formed by the ALD method using the WCl$_6$ gas as the tungsten chloride gas and the H$_2$ gas as the reduction gas, an adsorption operation of the WCl$_6$ gas and a reduction operation of WCl$_6$ by the H$_2$ gas as the reduction gas are repeated as shown in FIG. 3. A reaction that generates tungsten by reducing the adsorbed WCl$_6$ produces HCl according to the following Formula (1):

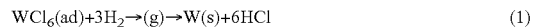

$$WCl_6(ad)+3H_2 \to (g) \to W(s)+6HCl \qquad (1)$$

Since HCl produced by this reaction has a strong etching property, it etches the tungsten film formed by a reaction according to the following Formula (2):

$$W(s)+5WCl_6(g) \to 6WCl_x \qquad (2)$$

Figure 4A:
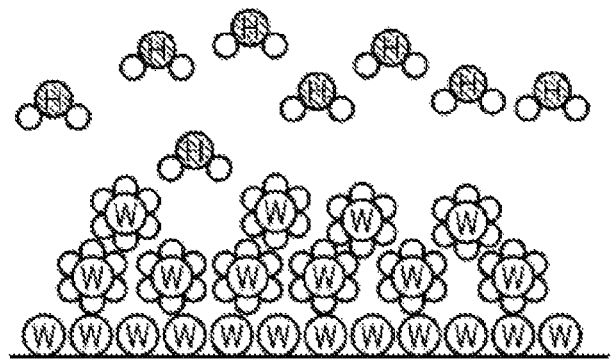
FIGS. 4A and 4B are views schematically showing film formation states when the tungsten film is formed on a flat portion and a patterned portion using the $WCl_6$ gas and the $H_2$ gas by the ALD method.
Figure 4B:
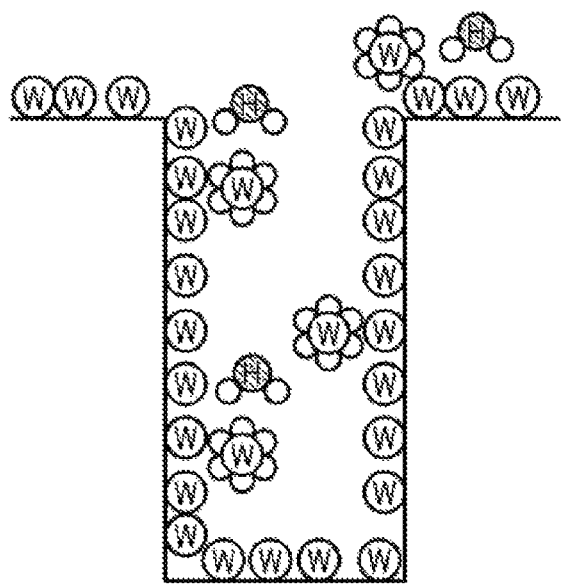

Such a reaction impedes the formation of the tungsten film. As shown in FIG. 4A, since a flow rate of the WCl$_6$ gas supplied per unit area in the flat portion is high (i.e., since a partial pressure of the WCl$_6$ gas is high), an amount of HCl per unit area becomes larger so that etching is likely to progress, which lowers a film forming rate of the tungsten film. On the contrary, as shown in FIG. 4B, since a patterned portion has an increased surface area so that the flow rate of the WCl$_6$ gas supplied per unit area in the patterned portion is low (i.e., the partial pressure of the WCl$_6$ gas is low), the amount of HCl per unit area becomes smaller so that etching is suppressed, which makes it possible to maintain the film forming rate of the tungsten film at a high level.

In particular, when the tungsten film is formed on a semiconductor device such as 3D NAND flash memory having a memory cell as the complex-shaped portion and the flat portion, the WCl$_6$ gas used as the film-forming raw material is required to be supplied at a relatively high flow rate in order to form a film on the entire region of the complex-shaped portion. However, if the WCl$_6$ gas is supplied at a sufficient flow rate to form the film on the entire region of the complex-shaped portion, the tungsten film is hardly deposited on the flat portion due to the HCL-based etching action.

Figure 5A:
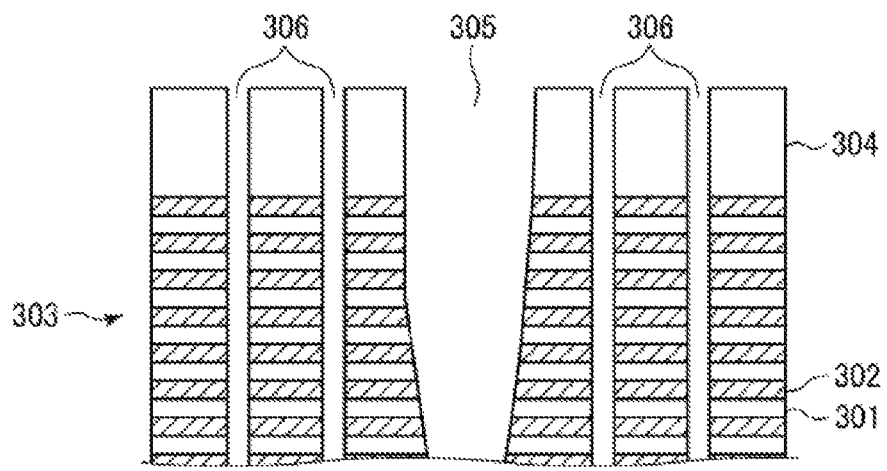
FIGS. 5A to 5C are cross-sectional process views explaining a process of manufacturing a 3D NAND flash memory.

Such a problem will be described with an example of a manufacturing process of the 3D NAND flash memory with reference to FIGS. 5 and 6. In the manufacturing process of the 3D NAND flash memory, a base structure (not shown) is first formed on a Si substrate (not shown), and subsequently, a stack body 303 that is obtained by alternately stacking SiO$_2$ films 301 and SiN films 302 in a level of, e.g., 24 to 70 layers, is formed on the base structure. Thereafter, an SiO$_2$ film 304 having a relatively thick thickness is formed on the stack body 303. Subsequently, a trench 305 and holes 306 are vertically formed by a dry etching, thereby obtaining a structure shown in FIG. 5A.

Thereafter, a columnar body 307 composed of an IPD film, a charge trap layer, a tunnel oxide film, a channel poly and a central oxide film is formed in each of the holes 306. Subsequently, the SiN film 302 is removed by a wet etching to form spaces 308, thereby obtaining a structure shown in FIG. 5B.

Figure 5B:
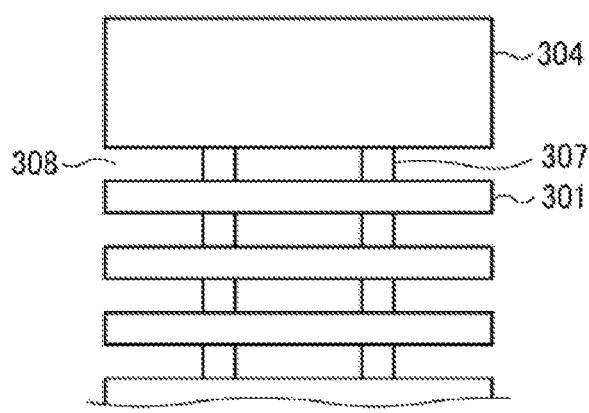
Figure 5C:
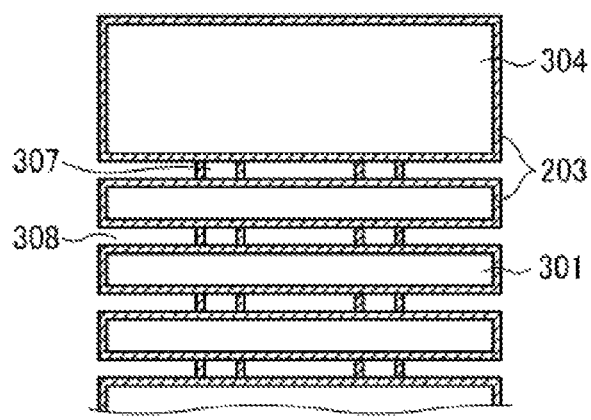
Figure 6A:
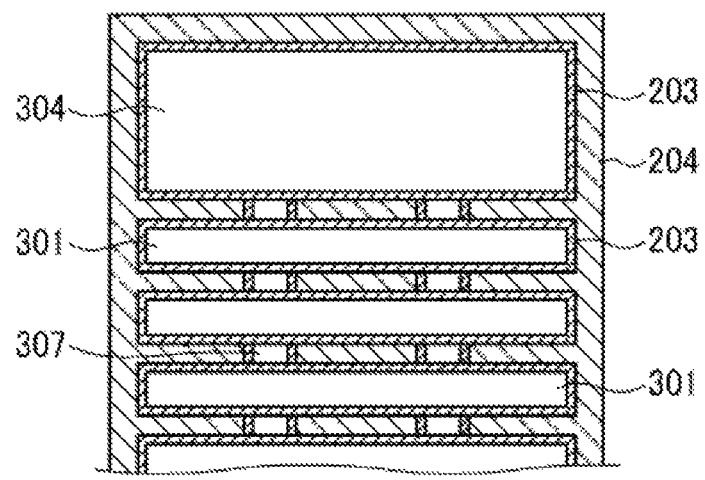
FIGS. 6A and 6B are cross-sectional process views explaining a process of manufacturing the 3D NAND flash memory.
Figure 6B:
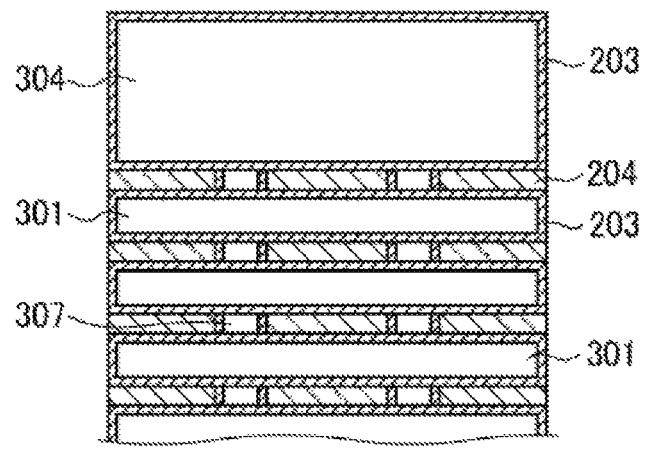

Thereafter, as shown in FIG. 5C, the base film 203 composed of a TiN film is formed over the entire surface of the structure shown in FIG. 5B. Subsequently, as shown in FIG. 6A, the tungsten film 204 is formed on the base film 203 composed of the TiN film. Thereafter, as shown in FIG. 6B, an extra region of the tungsten film 204 is removed by the wet etching.

In this way, a memory cell having a stack structure of the $SiO_2$ films 301 and the tungsten film 204 is formed. A portion of the stack structure corresponds to the complex-shaped portion having a high aspect ratio in which the number of stacked layers is large and sizes of the spaces 308 are miniaturized. Therefore, in order to widely diffuse the $WCl_6$ gas up to the lower space 308 and to form the tungsten film with a high step coverage, the flow rate of the $WCl_6$ gas needs to be increased up to a certain level.

Figure 7:
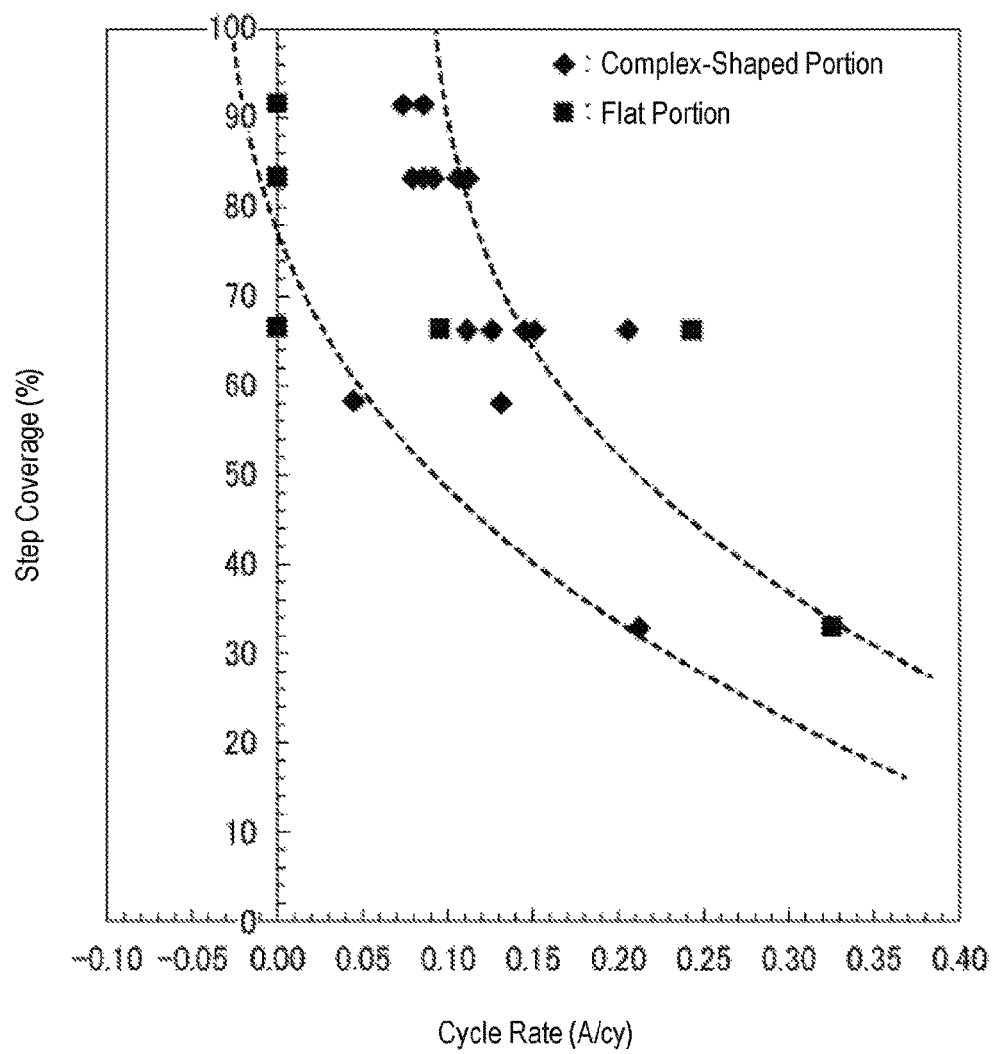
FIG. 7 is a view showing a relationship between a cycle rate (deposition amount per cycle) and a step coverage in the ALD method, when the tungsten film is formed on a flat portion and a complex-shaped portion using the $WCl_6$ gas and the $H_2$ gas by the ALD method.

However, since a surface of the $SiO_2$ film 304 formed at the uppermost position corresponds to the flat portion, if the $WCl_6$ gas is supplied at a sufficient flow rate to cover the entire region of the complex-shaped portion, the HCL-based etching action is likely to progress in the flat portion. As such, hardly any tungsten film is deposited. This situation will be described with reference to FIG. 7. FIG. 7 is a graph in which a horizontal axis indicates a cycle rate (a deposition amount per cycle) during the ALD process and a vertical axis indicates a step coverage. It can be seen from FIG. 7 that if the $WCl_6$ gas is supplied at a sufficient flow rate to ensure a high step coverage in the complex-shaped portion, hardly any tungsten film is formed on the flat portion.

Meanwhile, if the flow rate of the $WCl_6$ gas becomes higher, the HCL-based etching action is weak so that the tungsten film may be formed even in the flat portion. However, even if the $WCl_6$ gas is supplied with a level at which the tungsten film can be formed in the flat portion, it is difficult to widely spread the $WCl_6$ gas over the entire region of the complex-shaped portion.

In view of the foregoing, the process of supplying the $WCl_6$ gas at a relatively low flow rate to form the first tungsten film 205 and the process of supplying the $WCl_6$ gas at a relatively high flow rate to form the second tungsten film 206 are alternately repeated. Thus, it is possible to deposit the tungsten film on both the complex-shaped portion and the flat portion.

The tungsten film 204 is required to be formed with good buriability (high step coverage). To this end, the tungsten film 204 is formed by the ALD method which sequentially supplies the $WCl_6$ gas as the tungsten chloride gas and the $H_2$ gas as the reduction gas into the chamber 1 while purging the interior of the chamber 1 in the course of sequentially supplying the $WCl_6$ gas and the $H_2$ gas. Further, this embodiment is not limited to the ALD method in a strict sense, and tungsten film may be formed according to a sequence equivalent to the ALD method.

The flow rate of the $WCl_6$ gas in the course of forming the first tungsten film 205 may be determined as a sufficient level to form the tungsten film in the flat portion by minimizing the influence of the HCL-based etching action. Since an appropriate range of the flow rate of the $WCl_6$ gas varies depending on, e.g., a size of the chamber 1, the partial pressure of the $WCl_6$ gas inside the chamber 1 may be used as an indicator of the flow rate of $WCl_6$ gas. From the viewpoint of effectively forming the tungsten film in the flat portion, the partial pressure of the $WCl_6$ gas may be 1 Torr (133.3 Pa) or less. In some embodiments, the partial pressure of the $WCl_6$ gas may be 0.1 Torr (13.33 Pa) or less.

In some embodiments, the flow rate of the $WCl_6$ gas in the course of forming the second tungsten film 206 may be determined as a sufficient level to form the tungsten film over the entire region of the complex-shaped portion that is a portion where a device is to be formed. The partial pressure of the $WCl_6$ gas inside the chamber 1 may fall within a range of approximately 0.5 to 10 Torr (66.7 to 1,333 Pa).

In the formation of the tungsten film 204, either of the first tungsten film 205 and the second tungsten film 206 may be first deposited, but the first tungsten film 205 having the relatively low flow rate of the $WCl_6$ gas may be first deposited. The reason for this is that, in a region where the tungsten film in an initial stage of the film forming process is hardly deposited or a deposition amount thereof is small, the $WCl_6$ gas is directly supplied to the base film 203 so that the base film 203 is etched by the $WCl_6$ gas.

In other words, the reason for the above is that, when the base film 203 is a TiN film, an etching reaction as expressed by the following Formula (3) is induced between TiN and $WCl_6$ gases and a film thickness of the base film 203 is decreased by the etching reaction as the flow rate of the $WCl_6$ gas increases.

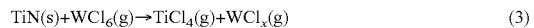

$$TiN(s)+WCl_6(g) \rightarrow TiCl_4(g)+WCl_x(g) \qquad (3)$$

Similarly, even when other titanium-based material films and tungsten compound films are used as the base film 203, the base film 203 is etched by the $WCl_6$ gas as the tungsten chloride gas. Thus, the first tungsten film 205 may be formed preferentially.

Figure 8:
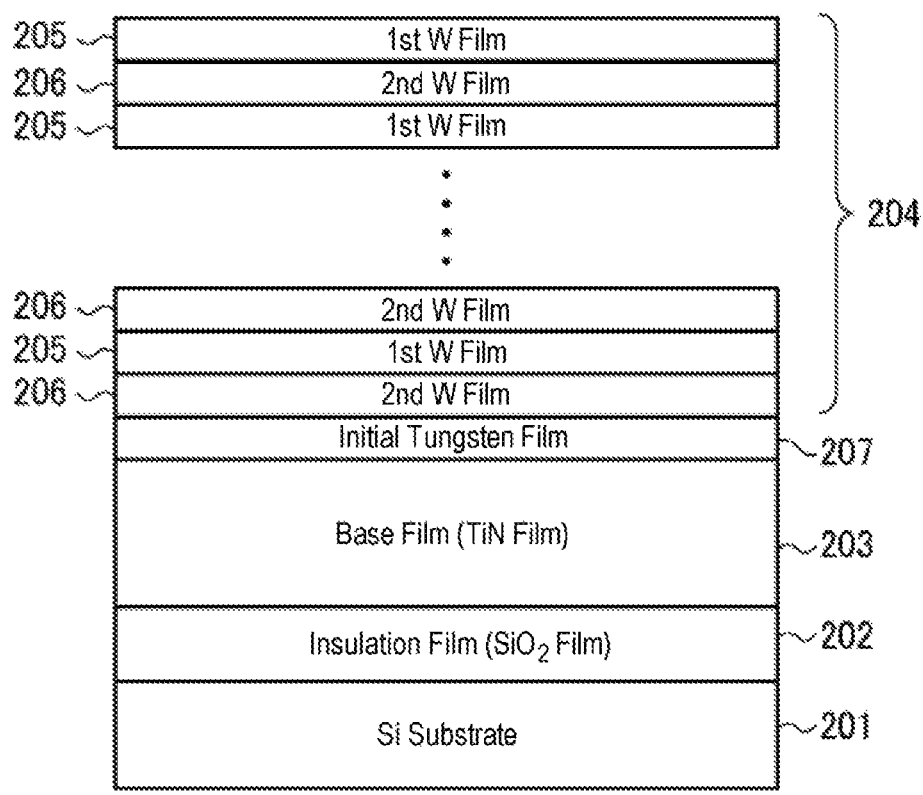
FIG. 8 is a cross-sectional view schematically showing a state where an initial tungsten film is formed between a base film and a tungsten film.

In some embodiments, as shown in FIG. 8, from the viewpoint of preventing the etching of the base film 203, an initial tungsten film 207 may be additionally formed on the base film 203 before forming the tungsten film 204. By additionally forming the initial tungsten film 207 as described above, the initial tungsten film 207 can be configured to have a thickness suitable to effectively prevent the base film 203 from being etched depending on the flow rate of the $WCl_6$ gas supplied to form the second tungsten film 206. The initial tungsten film 207 can be formed by the ALD method. However, since the initial tungsten film 207 is formed to prevent the base film 203 from being etched by the $WCl_6$ gas and does not require buriability similar to that of the tungsten film 204, the initial tungsten film 207 may be formed by the CVD method by simultaneously supplying the $WCl_6$ gas and the $H_2$ gas into the chamber 1. Further, a partial pressure of the $WCl_6$ gas during the formation of the initial tungsten film 207 is 1 Torr (133.3 Pa) or less as in the first tungsten film 205, in some embodiments, 0.1 Torr (13.33 Pa) or less. At this time, the partial pressure of the $WCl_6$ gas may be different from that during the formation of the first tungsten film 205.

Figure 9A:
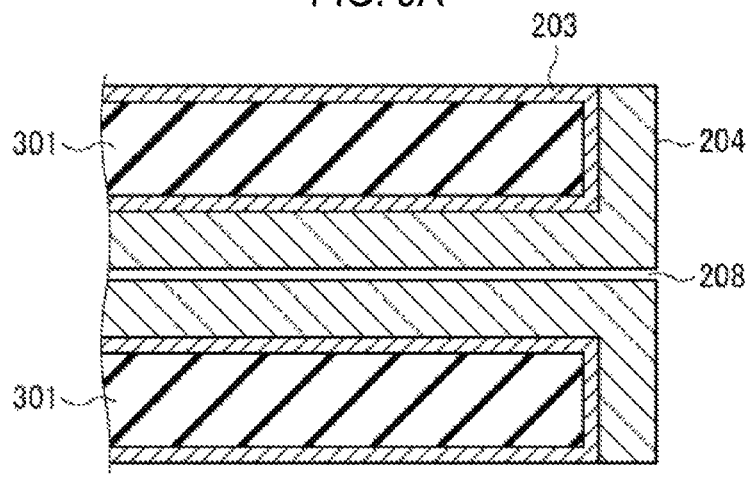
FIGS. 9A to 9C are views illustrating a problem that is caused when the tungsten film is subjected to a wet etching.
Figure 9B:
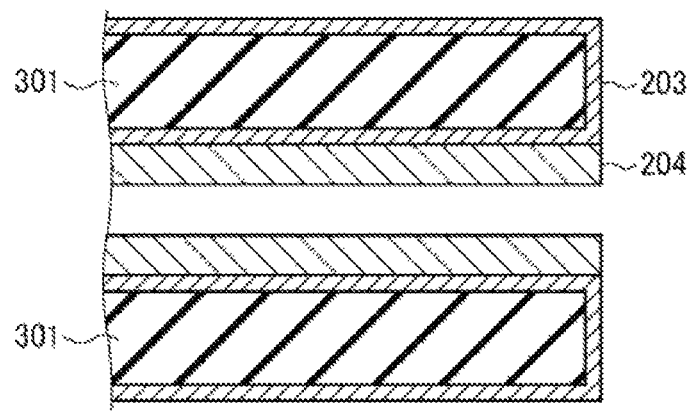
Figure 9C:
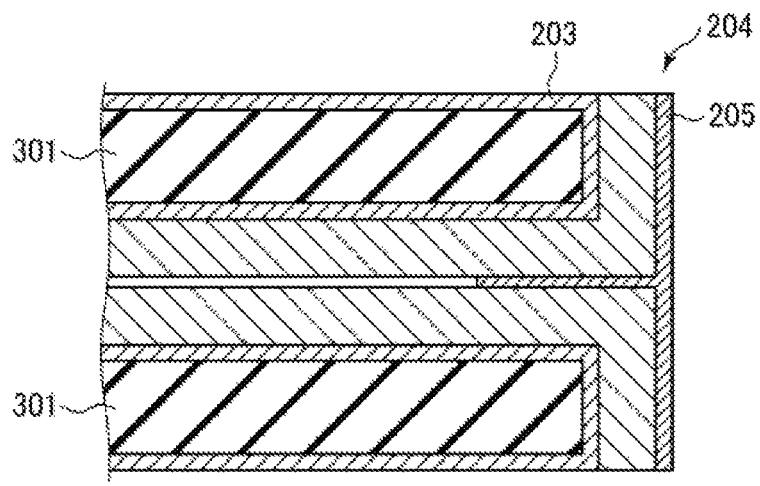

Further, when the tungsten film 204 is subjected to the wet etching, for example, when the extra region of the formed tungsten film 204 is subjected to the wet etching in the manufacturing process of the 3D NAND flash memory as shown in FIGS. 6A and 6B, if a finally-formed film in the formed tungsten film 204 is the second tungsten film for which the flow rate of the $WCl_6$ gas is low, the HCL-based etching action becomes strong. Thus, a surface of the tungsten film 204 becomes smooth so that a slight gap 208 is formed at a central portion of the tungsten film 204 as shown in FIG. 9A. If the wet etching is performed in such a state, some of the tungsten film in the buried portion is also etched as shown in FIG. 9B. For such a reason, it is preferable that the finally-formed film in the tungsten film 204 is the first tungsten film 205 which is formed by supplying the $WCl_6$ gas at a relatively low flow rate and manifests a weak etching action. That is to say, since the first tungsten film 205 is finally formed, the etching action is weak, whereby the gap 208 can be buried as shown in FIG. 9C.

Figure 10:
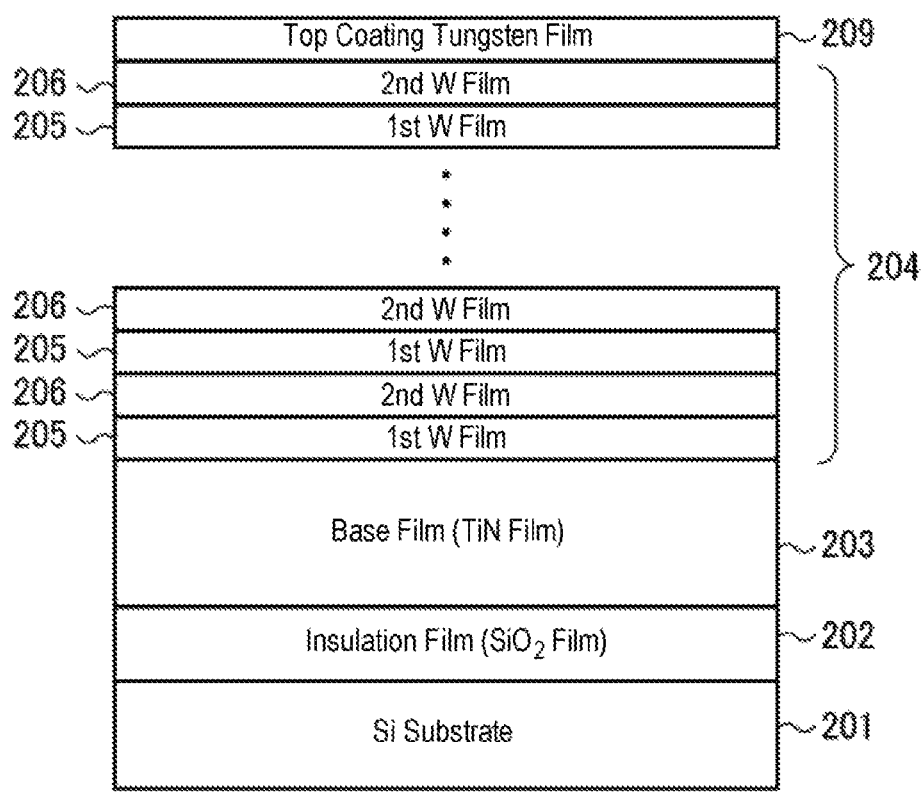
FIG. 10 is a cross-sectional view schematically showing a state where a top coating tungsten film is formed on the tungsten film.

In some embodiments, as shown in FIG. 10, a top coating tungsten film 209 may be additionally formed on the surface of the tungsten film 204 to bury the gap 208 defined in the tungsten film 204. By additionally forming the top coating tungsten film 209 as described above, the gap 208 can be appropriately buried by properly adjusting the flow rate of the $WCl_6$ gas and a thickness of the top coating tungsten film 209. The top coating tungsten film 209 may be formed by the ALD method. However, since the top coating tungsten film 209 is formed to bury the gap 208 and does not require buriability similar to that of the tungsten film 204, the top coating tungsten film 209 may be formed by the CVD method by simultaneously supplying the $WCl_6$ gas and the $H_2$ gas into the chamber 1. Further, it is preferable that the partial pressure of the $WCl_6$ gas in the course of forming the top coating tungsten film 209 is 1 Torr (133.3 Pa) or less as in the first tungsten film 205, in some embodiments, 0.1 Torr (13.33 Pa) or less. At this time, the partial pressure of the $WCl_6$ gas in the course of forming the top coating tungsten film 209 may be different from that in the course of forming the initial tungsten film 205.

Although the first tungsten film 205 and the second tungsten film 206 may be sequentially stacked one above another, such a sequential stack structure may be alternately repeated two times or more, in some embodiments, five times or more. Further, as described above, from the viewpoint of preventing the base film from being etched and preventing the buried tungsten from being etched during the wet etching of the tungsten film, the first tungsten films 205 may be formed at initial and final film-forming stages. In this case, a minimum unit of the stack structure is a three-layered structure of the first tungsten film 205—the second tungsten film 206—the first tungsten film 205. However, in the case where the initial tungsten film 207 or the top coating tungsten film 209 is formed, a stack sequence in the stack structure is not particularly restricted as long as at least one layer of the first tungsten film 205 and at least one layer of the second tungsten film 206 are formed in the stack structure. In some embodiments, each of the first tungsten film 205 and the second tungsten film 206 may have a film thickness ranging from 1 to 10 nm.

Further, although $WCl_6$ has been described to be used as the tungsten chloride used in forming the tungsten film 204, $WCl_5$ or $WCl_4$ may be used instead of $WCl_6$. These $WCl_5$ or $WCl_4$ manifest behaviors substantially equal to that of $WCl_6$.

Further, the reduction gas is not limited to the $H_2$ gas but may be other reduction gases which contain hydrogen. Instead of the $H_2$ gas, an $SiH_4$ gas, a $B_2H_6$ gas, an $NH_3$ gas or the like may be used as the reduction gas. Alternatively, two or more of the $H_2$ gas, the $SiH_4$ gas, the $B_2H_6$ gas and the $NH_3$ gas may be supplied. Moreover, in addition to these gases, other reduction gases such as a $PH_3$ gas or an $SiH_2Cl_6$ gas may be used. From the viewpoint of further decreasing impurities in the film to obtain a low resistance value, the $H_2$ gas may be used.

An inert gas such as an $N_2$ gas or an Ar gas may be used as the purge gas or the carrier gas.

In some embodiments, a temperature of the wafer during the formation of the tungsten film 204 may be 300 degrees C. or more. Further, an internal pressure of the chamber 1 may range from 20 to 100 Torr (from 2,666 to 13,330 Pa).
<Specific Sequence Using Film Forming Apparatus of FIG. 1>

Next, a specific sequence when using the film forming apparatus of FIG. 1 will be described.

First, the wafer W having a predetermined structure is loaded into the chamber 1 through the loading/unloading port 11 and subsequently, mounted on the susceptor 2 which has been heated to a predetermined temperature by the heater 21. The susceptor 2 is lifted up to the process position. The interior of the chamber 1 is vacuum-exhausted to a predetermined degree of vacuum. The on-off valves 104, 95a, 95b and 99 are closed and the on-off valves 102, 103, 96a and 96b are opened so that the interior of the film-forming raw material tank 91 is vacuum-exhausted through the EVAC pipe 101. Thereafter, the on-off valves 76 and 78 are opened and the on-off valves 73, 74, 75, 77 and 79 are closed such that the $N_2$ gases supplied from the first $N_2$ gas supply source 54 and the second $N_2$ gas supply source 55 are respectively introduced into the chamber 1 through the first continuous $N_2$ gas supply line 66 and the second continuous $N_2$ gas supply line 68, thereby increasing the internal pressure of the chamber 1 and stabilizing the temperature of the wafer W mounted on the susceptor 2.

After the internal pressure of the chamber 1 reaches a predetermined pressure, the on-off valves 102 and 103 are closed and the on-off valves 104, 95a and 95b are opened such that the internal pressure of the film-forming raw material tank 91 is increased, thus establishing a condition in which the $WCl_6$ gas as the tungsten raw material can be supplied.

In this state, the $WCl_6$ gas as the film-forming raw material gas, the $H_2$ gas as the reduction gas, and the $N_2$ gas as the purge gas are supplied in a sequential manner as described below. As described above, by changing the flow rate (partial pressure) of the $WCl_6$ gas to be supplied, the first tungsten film 205 and the second tungsten film 206 are alternately formed to obtain the tungsten film 204.

Figure 11:
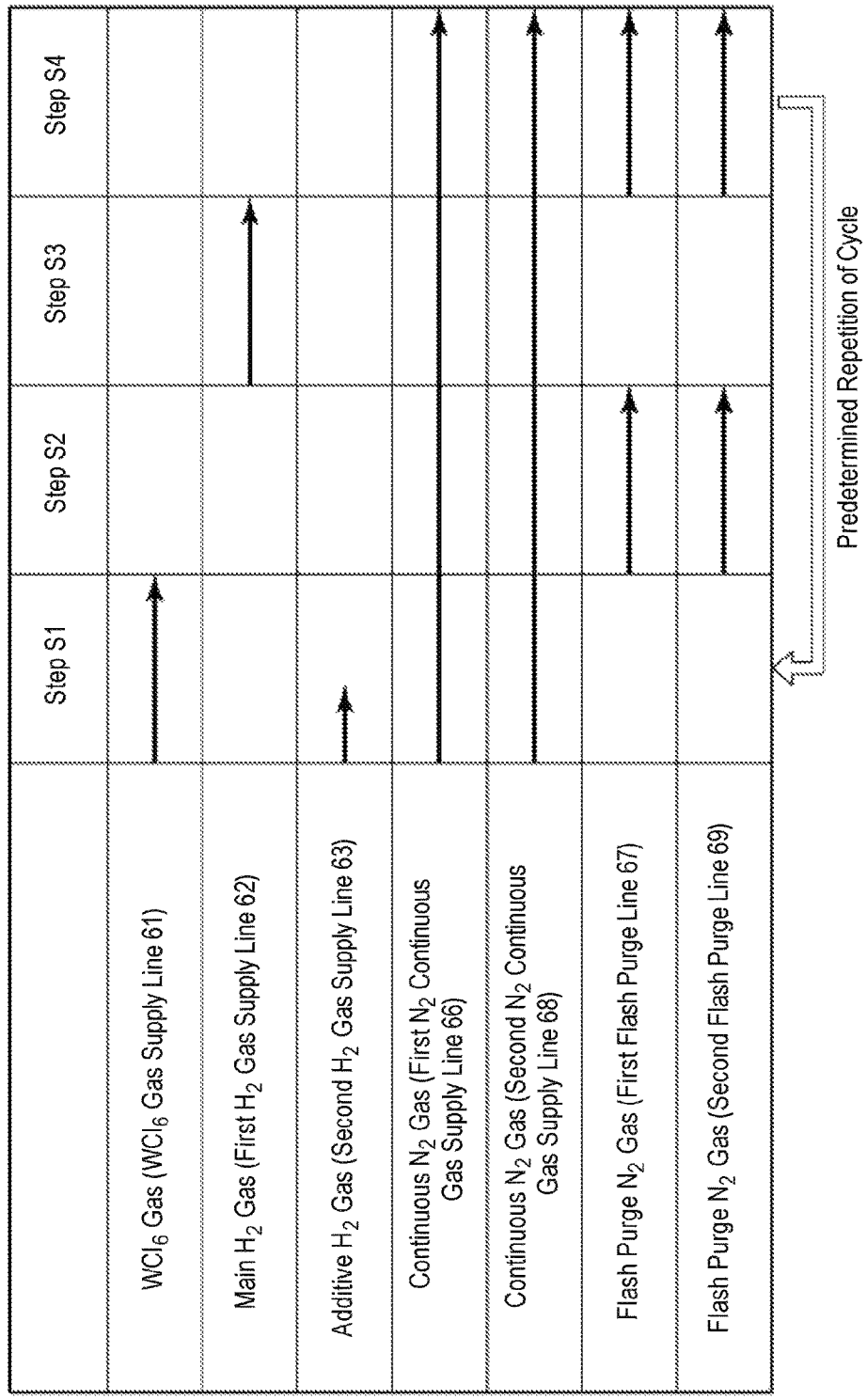
FIG. 11 is a view showing an example of a gas supply sequence by which a first tungsten film and a second tungsten film are formed.

FIG. 11 is a view showing an example of a gas supply sequence when forming the first tungsten film 205 and the second tungsten film 206.

First, the on-off valves 76 and 78 are opened and the $N_2$ gases are continuously supplied from the first $N_2$ gas supply source 54 and the second $N_2$ gas supply source 55 through the first continuous $N_2$ gas supply line 66 and the second continuous $N_2$ gas supply line 68. Further, the on-off valves 73 and 75 are opened and the $WCl_6$ gas is supplied from the $WCl_6$ gas supply mechanism 51 through the $WCl_6$ gas supply line 61 into the process space 37 in the chamber 1. The $H_2$ gas (i.e., the additive $H_2$ gas) as the additive reduction gas is supplied into the chamber 1 through the second $H_2$ gas supply line 63 extending from the second $H_2$ gas supply source 53 (in Step S1). At this time, the $WCl_6$ gas is first stored in the buffer tank 80 and then supplied into the chamber 1.

In Step S1, $WCl_6$ is adsorbed onto a surface of the wafer W. At this time, $WCl_6$ is activated by the $H_2$ gas which is simultaneously supplied into the chamber 1.

Subsequently, while the $N_2$ gas is continuously supplied through the first continuous $N_2$ gas supply line 66 and the second continuous $N_2$ gas supply line 68, the on-off valves 73 and 75 are closed to stop the supply of the $WCl_6$ gas and the $H_2$ gas, and simultaneously, the on-off valves 77 and 79 are opened to supply the $N_2$ gas (i.e., a flash purge $N_2$ gas) through the first flash purge line 67 and the second flash purge line 69. Thus, a high flow rate of the $N_2$ gas purges an extra $WCl_6$ gas and the like existing in the process space 37 (in Step S2).

Subsequently, the on-off valves 77 and 79 are closed to stop the supply of the $N_2$ gas through the first flash purge line 67 and the second flash purge line 69, while the $N_2$ gas is continuously supplied through the first continuous $N_2$ gas supply line 66 and the second continuous $N_2$ gas supply line 68. At this state, the on-off valve 74 is opened to supply the H₂ gas (i.e., the main H₂ gas) as the main reduction gas from the first H₂ gas supply source 52 into the process space 37 through the first H₂ gas supply line 62 (in Step S3). At this time, the H₂ gas is first stored in the buffer tank 81 and then supplied into the chamber 1.

In Step S3, WCl₆ adsorbed onto the wafer W is reduced. At this time, a flow rate of the main H₂ gas corresponds to a sufficient level to induce the reduction reaction and is lower than that of the additive H₂ gas in Step S1.

Subsequently, while the N₂ gas is continuously supplied through the first continuous N₂ gas supply line 66 and the second continuous N₂ gas supply line 68, the on-off valve 74 is closed to stop the supply of the H₂ gas through the first H₂ gas supply line 62, and the on-off valves 77 and 79 are opened to stop the supply of the N₂ gas (i.e., the flash purge N₂ gas) through the first flash purge line 67 and the second flash purge line 69. Thus, like in Step S2, a high flow rate of the N₂ gas purges the extra H₂ gas existing in the process space 37 (in Step S4).

A single cycle including Steps S1 to S4 described above is performed in a short period of time to form a unit tungsten film having a thin thickness. Further, the single cycle including Steps 1 to 4 is repeated a multiple number of times to form the first tungsten film and the second tungsten film each having a desired film thickness. The film thicknesses of the first tungsten film and the second tungsten film at this time can be controlled according to the number of repetitions of the single cycle.

Figure 12:
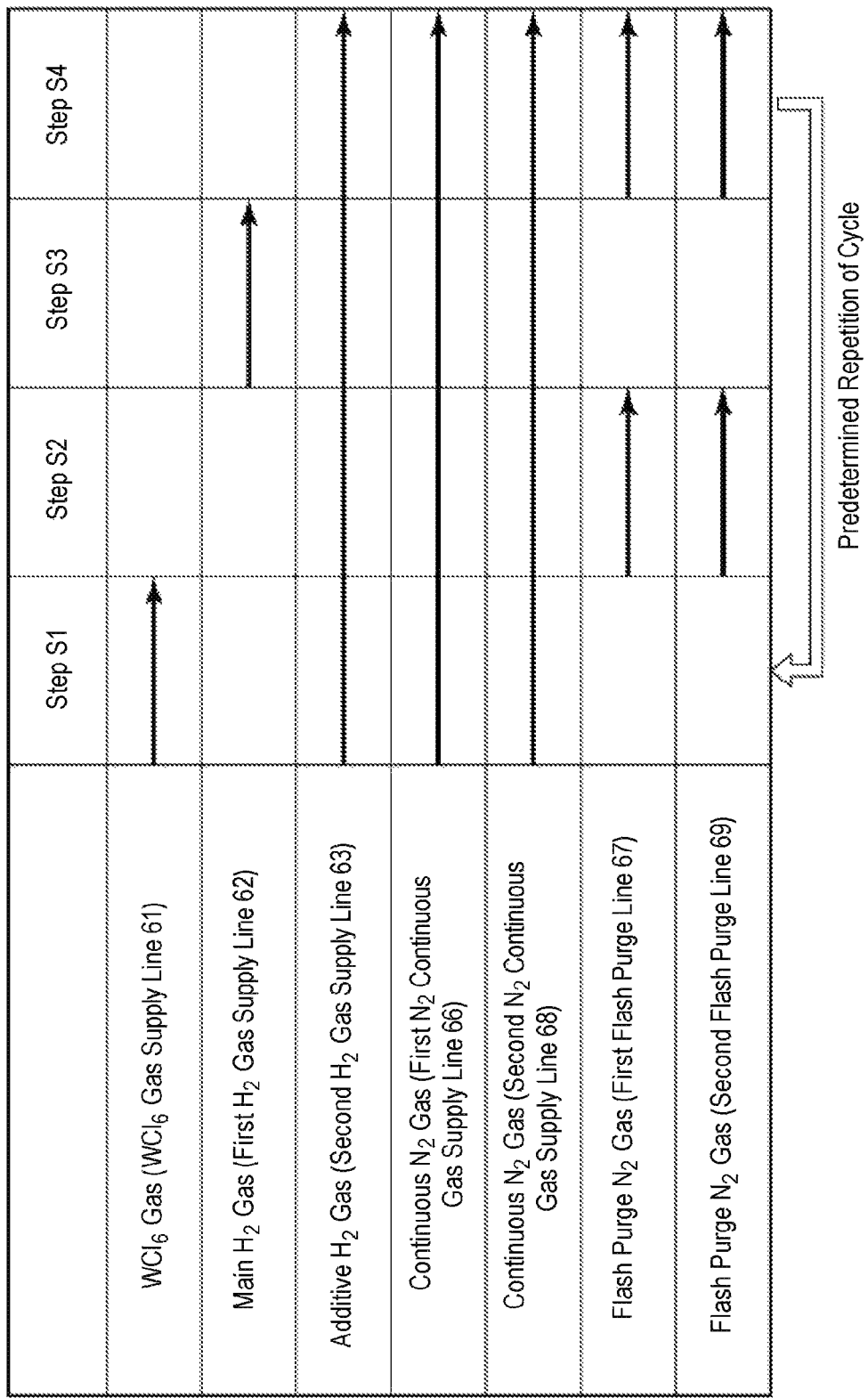
FIG. 12 is a view showing another example of the gas supply sequence by which the first tungsten film and the second tungsten film are formed.

In Step S1, in parallel with the supply of the WCl₆ gas, the additive reduction gas is also supplied through the second H₂ gas supply line 63 to activate the WCl₆ gas. This facilitates a film formation reaction in the subsequent Step S3. It is therefore possible to keep the step coverage at a high level and increase a thickness of the film formed per cycle, thus increasing a film forming rate. The flow rate of the H₂ gas at this time needs to be controlled to suppress the CVD-based reaction while ensuring the ALD-based reaction. Thus, the flow rate of the H₂ gas may range from 100 to 500 sccm (mL/min) In some embodiments, as shown in FIG. 12, the additive H₂ gas may be always supplied through the second H₂ gas supply line 63 during the period of Steps S2 to S4. With this configuration, when the WCl₆ gas is supplied, the additive H₂ gas as the additive reduction gas is also supplied, thus activating the WCl₆ gas. The flow rate of the H₂ gas at this time may range from 10 to 500 sccm (mL/min) from the viewpoint of suppressing the CVD-based reaction and keeping the ALD-based reaction. However, if a good film formation reaction is induced even in the absence of the additive H₂ gas, the additive H₂ gas may be omitted.

In the above sequence, the N₂ gas as the purge gas always flows from the first continuous N₂ gas supply line 66 and the second continuous N₂ gas supply line 68 to the WCl₆ gas supply line 61 and the first H₂ gas supply line 62 during the period of Steps S1 to S4, while the WCl₆ gas and the H₂ gas are intermittently supplied in Steps S1 and S3. It is therefore possible to improve a replacement efficiency of gas inside the process space 37. Further, the N₂ gas is supplied through each of the first flash purge line 67 and the second flash purge line 69 to purge the process space 37 in Steps S2 and S4. This further improves the replacement efficiency of gas inside the process space 37. It is therefore possible to control the thickness of the unit tungsten film at a good level.

In the film forming apparatus 100 shown in FIG. 1, the buffer tanks 80 and 81 are installed in the WCl₆ gas supply line 61 and the first H₂ gas supply line 62, respectively. This facilitates the supply of the WCl₆ gas and the H₂ gas in a short period of time. Thus, even if a period of the single cycle is short, it is possible to easily supply the WCl₆ gas and the H₂ gas at a flow rate required for Steps S1 and S3.

<Film Formation Conditions>

Next, an example of film formation conditions of the first tungsten film 205 and the second tungsten film 206 will be described.

(1) For the first tungsten film 205
  i) ALD
    Pressure: 20 to 100 Torr (2,666 to 13,330 Pa)
    Temperature: 300 degrees C. or more (in some embodiments, 450 to 600 degrees C.)
    Flow Rate of WCl₆ Gas: 0.1 to 10 sccm (mL/min)
    (Flow Rate of Carrier Gas: 1 to 1,000 sccm (mL/min))
    Partial Pressure of WCl₆ Gas (previously described): 1 Torr (133.3 Pa) or less (in some embodiments, 0.1 Torr (13.33 Pa) or less)
    Flow Rate of Main H₂ Gas: 10 to 5,000 sccm (mL/min)
    Flow Rate of Continuously-Supplied N₂ Gas: 10 to 10,000 sccm (mL/min)
      (through the first and second Continuous N₂ Gas supply lines 66 and 68)
    Flow Rate of Flash Purge N₂ Gas: 100 to 100,000 sccm (mL/min)
      (through the first and second Flash Purge Lines 67 and 69)
    Period of Time of Step S1 (Per Cycle): 0.01 to 5 sec
    Period of Time of Step S3 (Per Cycle): 0.1 to 5 sec
    Period of Time of each of Steps S2 and S4 (Purging) (Per Cycle): 0.1 to 5 sec
    Period of Supply Time of Additive H₂ Gas in Step S1 (Per Cycle): 0.01 to 0.3 sec
    Heated Temperature of Film-forming raw material tank: 130 to 190 degrees C.
  ii) CVD
    Pressure: 20 to 100 Torr (2,666 to 13,330 Pa)
    Temperature: 300 degrees C. or more (in some embodiments, 450 to 600 degrees C.)
    Flow Rate of WCl₆ Gas: 0.1 to 10 sccm (mL/min)
    (Flow Rate of Carrier Gas: 1 to 1,000 sccm (mL/min))
    Partial Pressure of WCl₆ Gas (previously described): 1 Torr (133.3 Pa) or less (in some embodiments, 0.1 Torr (13.33 Pa) or less)
    Flow Rate of Main H₂ Gas: 10 to 5,000 sccm (mL/min)
    Flow Rate of N₂ Gas: 10 to 10,000 sccm (mL/min)

(2) For the second tungsten film 206
    Pressure: 5 to 50 Torr (666.5 to 6,665 Pa)
    Temperature: 300 degrees C. or more (in some embodiments, 450 to 600 degrees C.)
    Flow Rate of WCl₆ Gas: 3 to 60 sccm (mL/min)
    (Flow Rate of Carrier Gas: 100 to 2,000 sccm (mL/min))
    Partial Pressure of WCl₆ Gas: 0.5 to 10 Torr (66.7 to 1,333 Pa)
    Flow Rate of Main H₂ Gas: 2,000 to 8,000 sccm (mL/min)
    Flow Rate of Additive H₂ Gas (previously described): 100 to 500 sccm (mL/min)
    Flow Rate of Continuously-Supplied N₂ Gas: 100 to 500 sccm (mL/min)
      (through the first and second Continuous N₂ Gas supply lines 66 and 68)
    Flow Rate of Flash Purge N₂ Gas: 500 to 3,000 sccm (mL/min)
      (through the first and second Flash Purge Lines 67 and 69)
    Period of Time of Step S1 (Per Cycle): 0.01 to 5 sec
    Period of Time of Step S3 (Per Cycle): 0.1 to 5 sec
    Period of Time of each of Steps S2 and S4 (Purging) (Per Cycle): 0.1 to 5 sec
    Period of Supply Time of Additive H₂ Gas in Step S1 (Per Cycle): 0.01 to 0.3 sec Heated Temperature of Film-Forming Raw Material Tank: 130 to 170 degrees C.

In some embodiments, the additional formation of the initial tungsten film 207 and the top coating tungsten film 209 may be performed under the same conditions as the first tungsten film 205 according to the sequences shown in FIGS. 11 and 12. Further, as described above, the initial tungsten film 207 and the top coating tungsten film 209 can be formed by the CVD method. In this case, the $WCl_6$ gas and the $H_2$ gas are simultaneously supplied from the $WCl_6$ gas supply line 61 and the first $H_2$ gas supply line 62, respectively.

According to the present disclosure in some embodiments, a process of supplying a metal chloride raw material at a relatively low flow rate to form a first tungsten film and a process of supplying the metal chloride raw material at a relatively high flow rate to form a second tungsten film are performed. Thus, it is possible to form a film on both a flat portion and the entire region of a complex-shaped portion by the processes of forming the first metal film and the second metal film. Accordingly, when a metal film is formed on a target substrate having the complex-shaped portion and the flat portion using the chloride raw material, the metal film can be formed over the entire region of the target substrate.

<Other Applications>

While the present disclosure has described exemplary embodiments, the present disclosure is not limited thereto, but may be modified in a variety of forms. As an example, although in the above embodiments, the tungsten film has been described to be formed using the tungsten chloride as the metal chloride, the present disclosure can be applied to other cases where a metal chloride gas and a reduction gas are sequentially supplied to form a metal film. For example, the present disclosure can be applied to a case where a molybdenum film is formed by a molybdenum chloride gas and a reduction gas, or a case where a tantalum film is formed by a tantalum chloride gas and a reduction gas.

Further, although in the above embodiments, the semiconductor wafer has been described to be used as a target substrate, the semiconductor wafer may be a silicon substrate, or a compound semiconductor such as GaAs, SiC and GaN or the like. The present disclosure is not limited to the semiconductor wafer but may be also applied to a glass substrate used in a flat panel display (FPD) such as a liquid crystal display, a ceramic substrate or the like.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for forming a metal film on a target substrate having a complex-shaped portion and a flat portion, the target substrate being loaded into a chamber which is maintained under a depressurized atmosphere, by sequentially supplying a metal chloride gas as a raw material gas and a reduction gas for reducing a metal chloride into the chamber while purging the chamber in the course of sequentially supplying the metal chloride gas and the reduction gas, the method comprising:

forming a first metal film by supplying the metal chloride gas at a first flow rate; and forming a second metal film by supplying the metal chloride gas at second flow rate higher than the first flow rate, wherein the forming a first metal film and the forming a second metal film are alternately performed a plurality number of times.

2. The method of claim 1, wherein the target substrate has a base film formed thereon, and the first metal film is formed on the base film.

3. The method of claim 1, wherein the target substrate has a base film formed thereon, and an initial metal film is formed between the metal film and the base film by sequentially supplying the metal chloride gas and the reduction gas into the chamber while supplying a purge gas in the course of sequentially supplying the metal chloride gas and the reduction gas, or by simultaneously supplying the metal chloride gas and the reduction gas into the chamber, wherein a flow rate of the metal chloride gas is lower than that used in forming the second metal film.

4. The method of claim 1, wherein a final film formed in the formation of the metal film is the first metal film.

5. The method of claim 1, wherein a top coating metal film is formed on the metal film by sequentially supplying the metal chloride gas and the reduction gas into the chamber while supplying a purge gas in the course of sequentially supplying the metal chloride gas and the reduction gas, or by simultaneously supplying the metal chloride gas and the reduction gas into the chamber, wherein a flow rate of the metal chloride gas is lower than that used in forming the second metal film.

6. The method of claim 1, wherein a tungsten chloride is used as the metal chloride to form a tungsten film as the metal film.

7. The method of claim 6, wherein gas of the tungsten chloride is supplied such that a partial pressure of the tungsten chloride gas inside the chamber in the forming the first metal film is 1 Torr or less.

8. The method of claim 6, wherein gas of the tungsten chloride is supplied such that a partial pressure of the tungsten chloride gas inside the chamber in the forming the second metal film falls within a range from 0.5 to 10 Torr.

9. The method of claim 6, wherein, in the forming the first metal film and the second metal film, a temperature of the target substrate is 300 degrees C. or more, and an internal pressure of the chamber is 5 Torr or more.

10. The method of claim 6, wherein the tungsten chloride includes one of $WCl_6$, $WCl_5$, and $WCl_4$.

11. The method of claim 1, wherein the reduction gas is at least one of an $H_2$ gas, an $SiH_4$ gas, a $B_2H_6$ gas and an $NH_3$ gas.

* * * * *